United States Patent

Maruyama

[11] Patent Number: 6,092,082
[45] Date of Patent: Jul. 18, 2000

[54] DIGITAL AUDIO RECORDER AND PLAYER WITH ADDRESS BACKUP FUNCTION

[75] Inventor: Katsuya Maruyama, Miyazaki, Japan

[73] Assignee: Oki Micro Design Miyazaki Co., Ltd., Miyazaki-pref., Japan

[21] Appl. No.: 09/018,917

[22] Filed: Feb. 5, 1998

[30] Foreign Application Priority Data

Mar. 26, 1997 [JP] Japan ................................ 9-073900

[51] Int. Cl.⁷ ............................................... G06F 17/30
[52] U.S. Cl. ................................... 707/200; 709/231
[58] Field of Search .............................. 707/200, 202; 711/173; 709/231

[56] References Cited

U.S. PATENT DOCUMENTS

| 5,668,948 | 9/1997 | Belknap et al. | 709/231 |
| 5,805,821 | 9/1998 | Saxena et al. | 709/231 |
| 5,825,353 | 10/1998 | Will | 345/184 |
| 5,841,699 | 11/1998 | Miyauchi | 365/185 |
| 5,860,135 | 1/1999 | Sugita | 711/173 |
| 5,974,426 | 10/1999 | Lee | 707/202 |

FOREIGN PATENT DOCUMENTS

| 0 533 608 | 3/1993 | European Pat. Off. |
| 0 747 823 | 12/1996 | European Pat. Off. |
| 31 30 546 | 4/1983 | Germany |
| 07264282 | 10/1995 | Japan |

OTHER PUBLICATIONS

Japan Abstract 61150195, published Jul. 8, 1986, Koibuchi Shoichi; Yamatake Honeywell Co., Ltd.; Memory Content Storing Method (filed Dec. 25, 1984).

*Primary Examiner*—Wayne Amsbury
*Attorney, Agent, or Firm*—Rabin & Champagne, PC

[57] ABSTRACT

A digital audio recorder and player stores addresses of recorded audio data in at least two directories. The directories are used cyclically, address information always being read from the directory with the most recent valid address information. After a recording or editing operation, the address information read from this directory is updated, then stored in the next directory in the cycle. Each directory preferably also stores tag information identifying the directory with the most recent address information. The directories can be stored on the same digital recording medium as the audio data. This medium is, for example, a flash memory device.

21 Claims, 8 Drawing Sheets

DIGITAL AUDIO RECORDER AND PLAYER WITH ADDRESS BACKUP FUNCTION

BACKGROUND OF THE INVENTION

The present invention relates to a digital audio recorder and player, more particularly to a digital audio recorder and player that automatically stores backup address information.

Digital audio recorders are used as voice memo recorders, and as voice message recorders in portable telephone sets. Some digital audio recorders employ nonvolatile semiconductor memory, such as flash memory, as a recording medium. A single memory device may store several recorded messages, so address information indicating where each message begins and ends is also stored. In a flash memory device, the address information is conventionally stored in a single sector or page, which is erased and rewritten whenever a new message is recorded.

Nonvolatile semiconductor memory devices in general, and flash memory in particular, can tolerate only a limited number of erase-write cycles. Since the address information page is updated frequently, this page may reach its tolerance limit comparatively early, at which point the page no longer stores address information reliably. The user will find that his telephone set or voice recorder can no longer be trusted to record and play messages correctly.

Another problem is that a power interruption or other unforeseen occurrence while the address information page is being rewritten may cause part or all of the address information to be lost, making it impossible to play back the messages recorded in the semiconductor memory device. Address information may also be unintentionally erased by the user, with similar consequences.

SUMMARY OF THE INVENTION

It is accordingly an object of the present invention to extend the useful life of a digital audio recorder and player.

Another object of the invention is to improve the reliability of a digital audio recorder and player.

A further object is to prevent the loss of recorded audio data by unintentional erasure.

The invented audio recorder and player records audio data on at least one digital recording medium, and stores address information indicating where the audio data has been recorded in at least two directories. The directories are used cyclically, address information always being read from the directory with the most recent valid address information. After a recording or editing operation, the address information read from this directory is updated, then stored in the next directory in the cycle.

Each directory preferably also stores tag information that is written and read together with the address information. The tag information can be used to identify the directory storing the most recent address information, and can be checked to determine the validity of the address information. The tag information comprises, for example, a pair of complementary symbols, the values of which are modified when written to the last directory in the cycle, or two identical pairs of complementary symbols, one pair being stored at each end of the directory.

The audio data and directories may be stored on the same digital recording medium. This medium may be a nonvolatile semiconductor memory divided into individually erasable pages, each directory occupying one page. In particular, a flash memory medium may be used.

DETAILED DESCRIPTION OF THE INVENTION

Two embodiments of the invention will be described with reference to the attached illustrative drawings, following a general description of a digital audio recorder and player employing flash memory. The general description applies to both embodiments.

Figure 1:
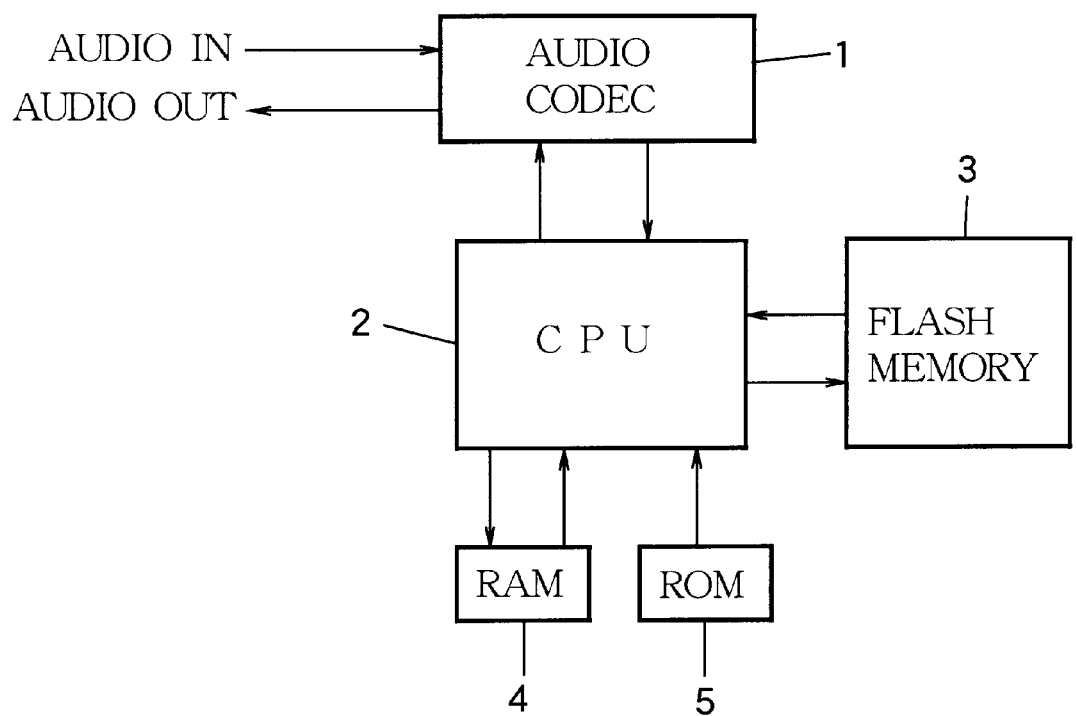
FIG. 1 is a block diagram showing parts of a digital audio recorder and player.

FIG. 1 shows the relevant parts of this digital audio recorder and player, these being an audio coder-decoder or codec 1, a central processing unit (CPU) 2, a flash memory 3, a random-access memory (RAM) 4, and a read-only memory (ROM) 5. Peripheral components, such as controls by which the operator initiates recording, playing, and editing operations, have been omitted to simplify the drawing.

The audio codec 1 has an analog-to-digital converter that converts an analog audio input signal to audio data, and a digital-to-analog converter that converts audio data to an analog audio output signal that can be reproduced through a loudspeaker or earphone. The audio codec 1 may also have digital signal-processing circuitry for compressing and decompressing the audio data; alternatively, the compressing and decompressing may be performed in the CPU 2.

The CPU 2 is, for example, the central processing unit of a microcontroller. The RAM 4 and ROM 5 may also be components of the microcontroller.

Figure 2:
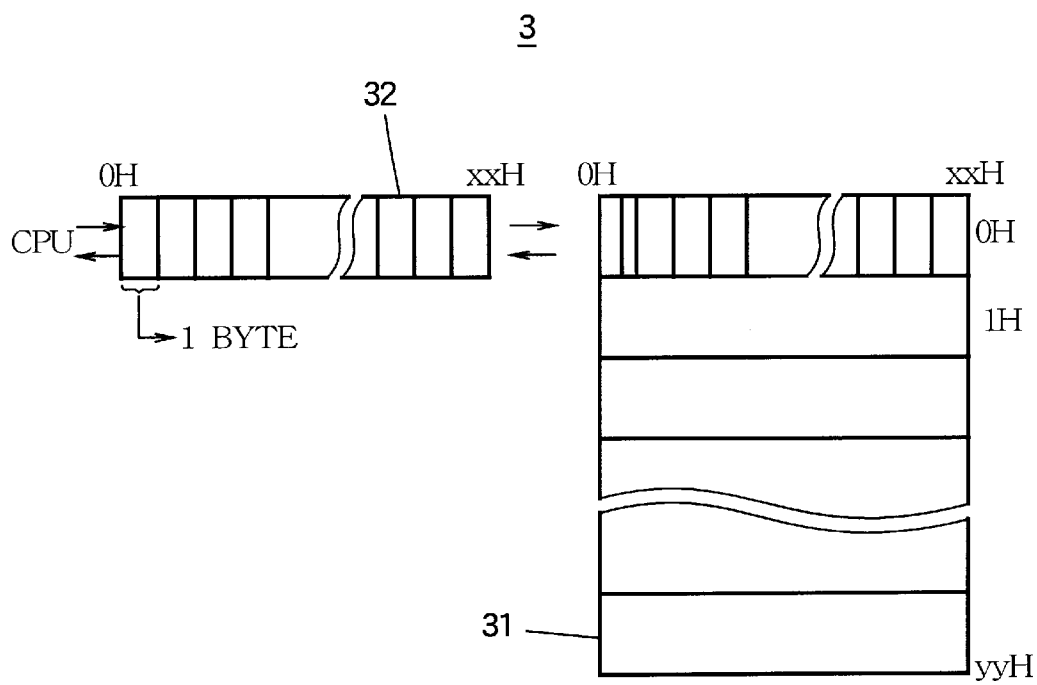
FIG. 2 is a more detailed diagram of the flash memory in FIG. 1.

The flash memory 3 has a memory array 31 that is divided into pages as shown in FIG. 2. Each page stores a number of bytes of data, the bytes being hexadecimally addressed from OH to xxH. The pages themselves are addressed from OH to yyH. The capacity of each page is, for example, two hundred fifty-six bytes (xxH=FFH), and the number of pages is, for example, one thousand twenty-four (yyH=3FFH). When data in the memory array 31 are erased, one entire page is erased at a time.

The flash memory 3 also has at least one buffer 32 through which data are read from and written into the memory array 31. The buffer 32 has the same capacity as one page, and is addressed in the same way from OH to xxH.

Figure 3:
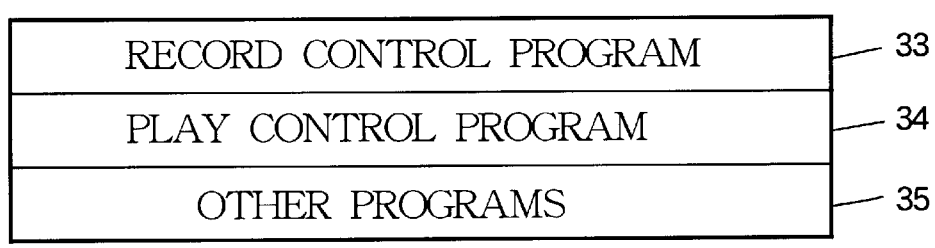
FIG. 3 is a more detailed diagram of the read-only memory in FIG. 1.

As shown in FIG. 3, the ROM 5 stores programs, executed by the CPU 2, by which the digital audio recorder and player is controlled. These programs include a record control program 33, a play control program 34, and various other programs 35. The CPU 2 and record control program 33, taken together, constitute the record controller of the audio recorder and player, while the CPU 2 and play control program 34 constitute the play controller.

First Embodiment

Figure 4:
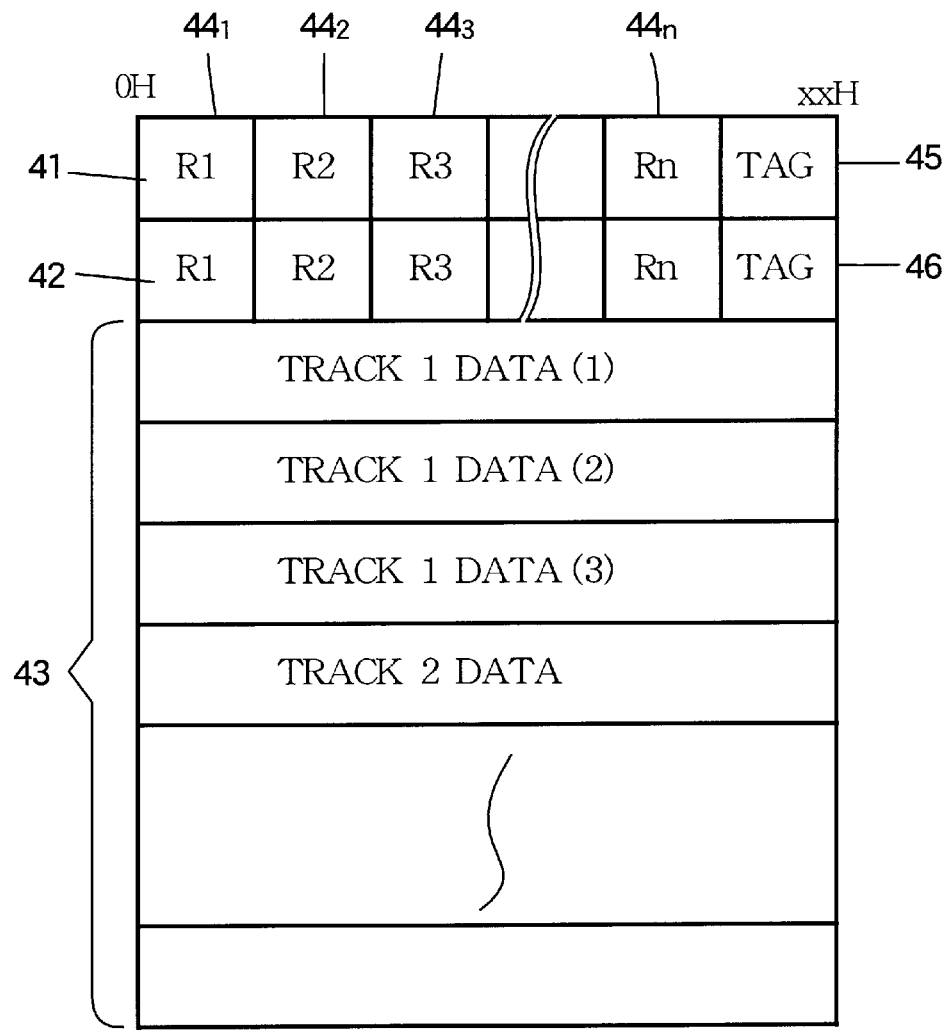
FIG. 4 illustrates the data structure of the flash memory in a first embodiment of the invention.

FIG. 4 shows the data structure of the flash memory 3 in a first embodiment of the invention. The flash memory 3 is used as a digital recording medium for both address information and audio data. The first two pages are allocated for use as directories 41 and 42; the other pages 43 are used for storing audio data. When a sequence of audio data, such as a telephone message, is recorded, pages 43 are allocated one at a time, as needed. The set of pages storing one complete sequence of audio data (e.g. one message) is referred to below as a track. The pages in a track need not be consecutive; each page can end, for example, with an address pointer to the next page, enabling pages to be allocated in a random sequence.

Figure 5:
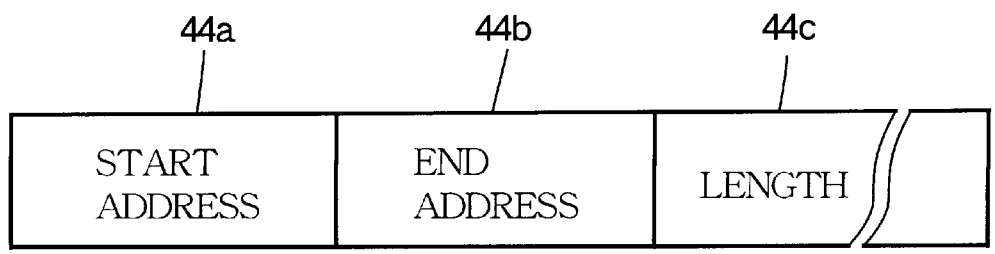
FIG. 5 illustrates an address record.

The first directory 41 has record fields $44_1, 44_2, \ldots, 44_n$ for storing a plurality of address records R1, R2, ..., Rn, and a tag field for storing tag information 45. The second directory 42 has record fields for storing a similar plurality of address records R1, ..., Rn, and a tag field for storing tag information 46. As shown in FIG. 5, each address record comprises a start address field 44a, an end address field 44b, and a length field 44c, in which are stored the starting page address, ending page address, and length (number of pages) of the corresponding track.

Figure 6:
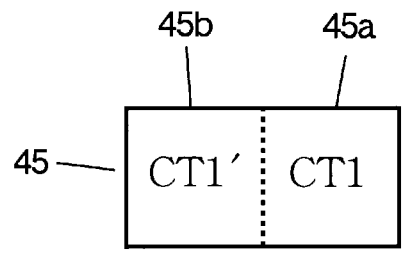
FIG. 6 illustrates the tag field in the first directory in FIG. 4.
Figure 7:
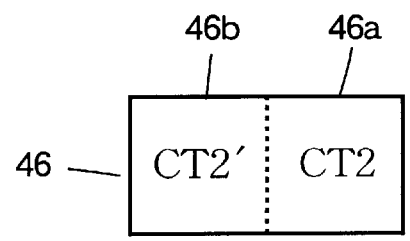
FIG. 7 illustrates the tag field in the second directory in FIG. 4.

Referring to FIG. 6, the tag 45 in the first directory comprises two complementary tag symbols CT1 and CT1'. Referring to FIG. 7, the tag 46 in the second directory comprises two complementary tag symbols CT2 and CT2'. Each symbol is, for example, a single hexadecimal digit (four bits), making each of the tags 45 and 46 just one byte in size.

Figure 8:
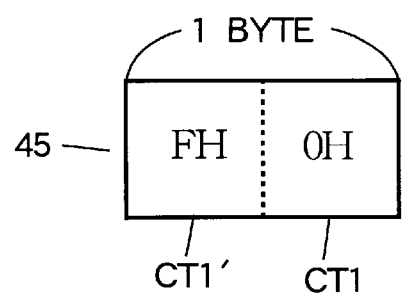
FIG. 8 illustrates data stored in the above tag fields.
Figure 8:
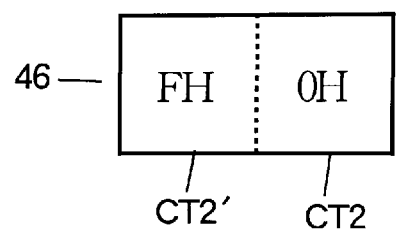

Next, the recording operation of the first embodiment will be described, starting from the state shown in FIG. 8, in which symbols CT1 and CT2 both have the value zero (OH). Symbols CT1' and CT2' both have the hexadecimal value F (FH), which is the one's complement of zero.

When a new message is recorded, the audio codec 1 converts the message to audio data, which the CPU 2 stores in the flash memory 3. The recording is done a page at a time. The CPU 2 transfers one page of audio data into the buffer 32, consults an allocation table (not shown in the drawings) to find an unallocated page in the memory array 31, allocates that page, then issues a command that writes the data from the buffer 32 into the allocated page. Writing a page of data in the memory array 31 takes about ten to twenty milliseconds; during this time, the audio codec 1 and CPU 2 are preparing the data that will be stored in the next page.

Figure 9:
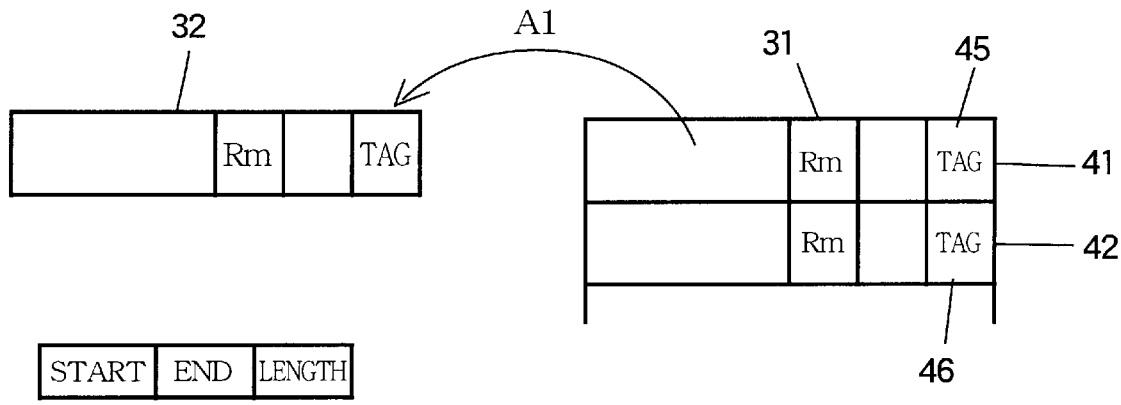
FIG. 9 illustrates the operation of the first embodiment after the recording of a first message.

Referring to FIG. 9, when the recording is completed, the CPU 2 prepares new address information describing the track in which the message has been recorded. The new address information, equivalent to one address record, is prepared in the RAM 4.

Next, the CPU 2 reads and checks the tags 45 and 46 to decide which directory holds the most recent reliable address information. If both tags contain the same two complementary symbols, as in the present case, the CPU 2 selects the first directory 41, and issues a command that transfers the entire contents of the first directory 41 into the buffer 32 (as indicated by arrow A1).

The tag information need not always be read from the flash memory 3; the CPU can maintain copies of the tags in the RAM 4, and read these copies. If tag information is read from the RAM 4, then after the selected directory has been read into the buffer 32, the CPU 2 also reads the tag field from the buffer 32, and checks that the tag information has the expected value.

Figure 10:
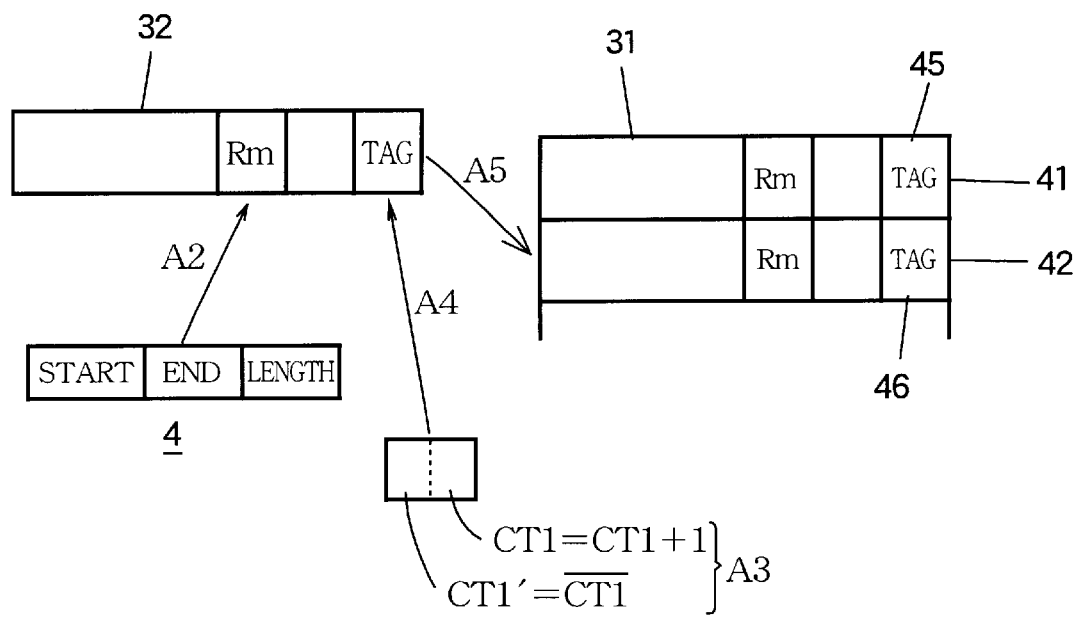
FIG. 10 further illustrates the operation after the recording of the first message.

After the contents of the first directory 41 have been transferred into the buffer 32, the CPU 2 finds an unused address record Rm and transfers the new address information from the RAM 4 into this record Rm in the buffer 32, as shown in FIG. 10 (arrow A2). The CPU 2 also updates the tag information by incrementing symbol CT1, sets symbol CT1' equal to the one's complement of the incremented value of CT1 (operation A3), and writes these new symbol values in the tag field in the buffer 32 (arrow A4). Next, the second directory 42 is erased; then the entire contents of the buffer 32, including the new address record Rm and modified tag information, are transferred from the buffer 32 to the second directory 42 (arrow A5).

As a result, the first directory 41 retains the old address information and old tag value (FOH), while the second directory 42 receives updated address information and a modified tag value (E1H).

Figure 11:
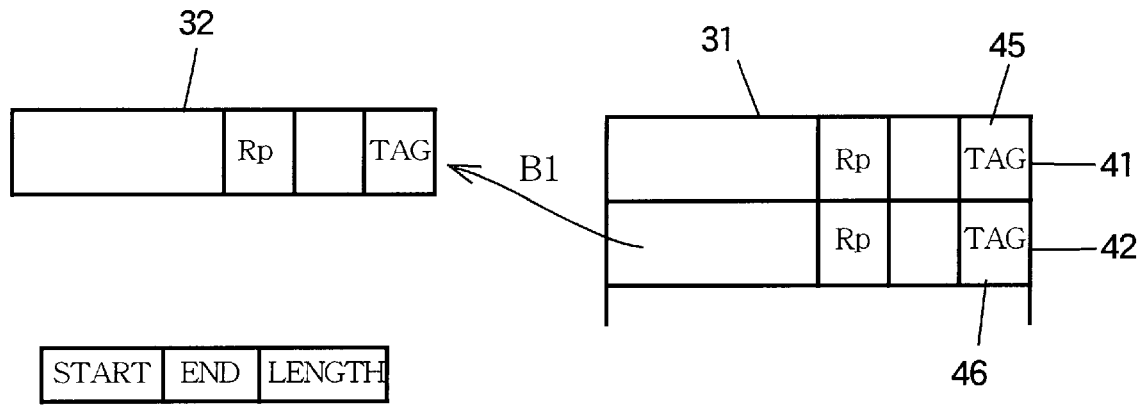
FIG. 11 illustrates the operation of the first embodiment after the recording of a second message.
Figure 12:
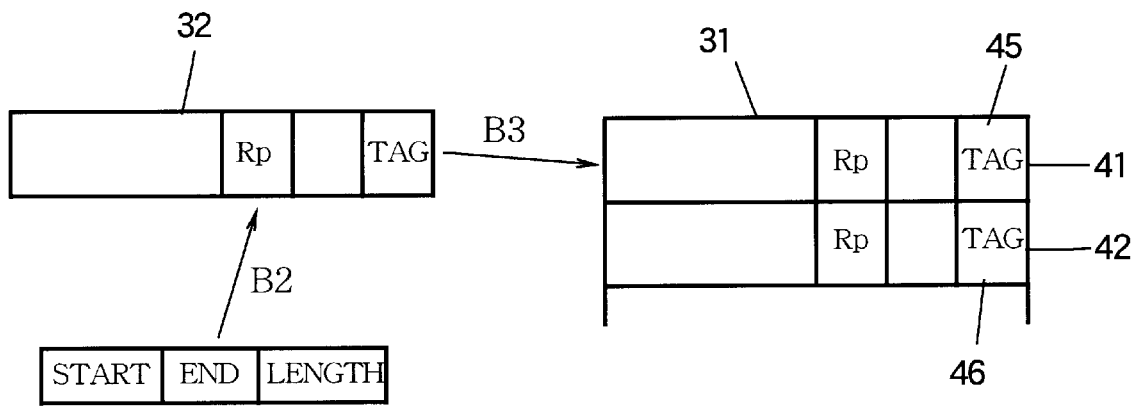
FIG. 12 further illustrates the operation after the recording of the second message.

When the next new message is recorded, the CPU 2 carries out a similar process. This time, when the tags 45 and 46 are read, they are found to contain different complementary tag information. The CPU 2 accordingly selects the second directory 42, reads this directory 42 into the buffer 32 (arrow B1 in FIG. 11), finds an unused address record Rp, transfers new address information from the RAM 4 into this record Rp (arrow B2 in FIG. 12), then issues commands that erase the first directory 41 and transfer the entire contents of the buffer 32 to the first directory 41 (arrow B3).

The CPU 2 does not modify the tag information this time. As a result, the tags 45 and 46 in both directories 41 and 42 now have the same value (E1H).

Figure 13:
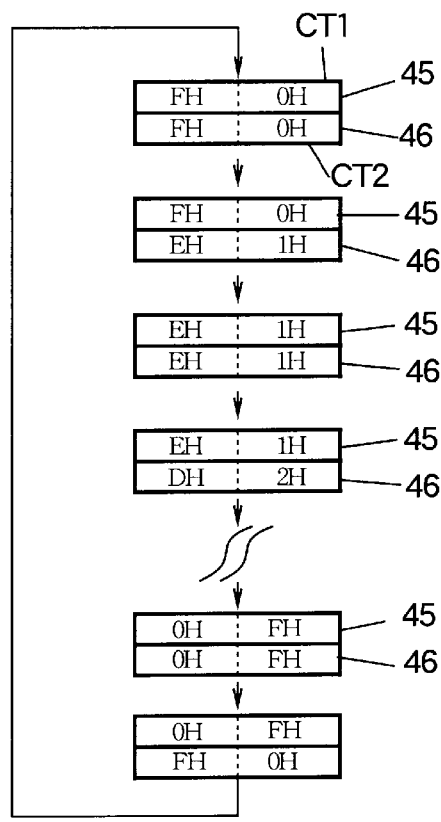
FIG. 13 illustrates the cyclic updating of the tag fields in the first embodiment.

As later messages are recorded, the process of updating the tag values continues as shown in FIG. 13. When symbols CT1 and CT2 have the same value, the CPU 2 reads the first directory 41, updates the address information, modifies the tag value, and writes the updated address information and modified tag value in the second directory 42. When symbols CT1 and CT2 differ, the CPU 2 reads the second directory 42, updates the address information, and writes the updated address information in the first directory 41 without modifying the tag value, restoring symbols CT1 and CT2 to equality.

Since the two directories 41 and 42 are used alternately, each undergoes only half as many erase-write cycles as in a conventional audio recorder and player, in which all address information is stored in a single page. The useful life of the flash memory 3 is thereby doubled.

Figure 14:
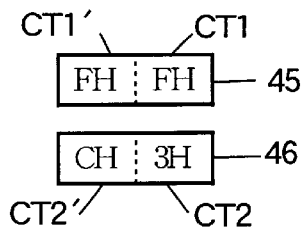
FIG. 14 illustrates an error condition in the first embodiment.

When checking the tag information, the CPU 2 may find that one of the two tags does not contain two complementary symbol values. In FIG. 14, for example, the tag 45 in the first directory contains non-complementary symbol values (both FH), while the tag 46 in the second directory contains complementary symbol values (CH and 3H). In this case, the CPU 2 regards the directory with non-complementary tag symbols as unreliable, and reads address information from the other directory.

Accordingly, if a power interruption, an unexpected reset, or some other unanticipated event occurs while address information is being written in one of the two directories, all is not lost. The CPU 2 can still obtain address information for all but the most recently recorded track from the other directory, which serves as a backup.

It may also happen that neither tag 45 or 46 contains two complementary symbol values, indicating that the contents of both directories are unreliable. In this case the CPU 2 should output an error indication. Preferably, the record control program 33 also includes a rescue routine that reads both directories 41 and 42, compares their contents, and extracts any address information that appears valid.

Next, the use of the directories 41 and 42 in playing and editing operations will be described.

Play control includes the same tag check as in record control, enabling the CPU 2 to select and read the most recent reliable address information. Audio data tracks are then played on the basis of that address information, in response to commands from the user. Even if a power interruption or the like has occurred, the user should be able to hear all but the most recently recorded track.

Editing includes, for example, the erasing of one or more tracks. The CPU 2 finds the directory with the most recent reliable address information as described above, reads the contents of this directory into the buffer 32, and erases the designated tracks by initializing their address records, returning these address records to the unused state. The updated address information is then written into the other directory, the tag value being modified if this other directory is the second directory 42. The pages containing the audio data are not themselves erased at this time. A consequent advantage is that if the user erases a track by mistake, the mistake can be undone by reading the backup address information from the directory that has not been updated.

Second Embodiment

Figure 15:
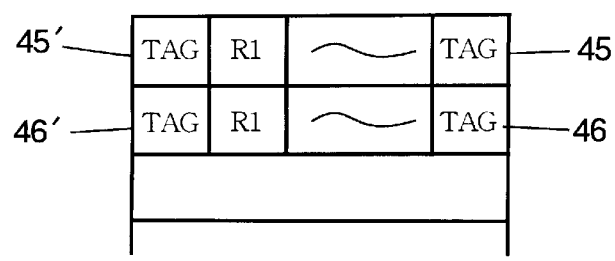
FIG. 15 illustrates the directories in a second embodiment of the invention.

Referring to FIG. 15, the second embodiment is similar to the first embodiment, except that the first directory now has two tags 45 and 45', and the second directory has two tags 46 and 46'. The two tag fields are disposed at opposite ends of each directory. Tags 45 and 46 are used in the same way as in the first embodiment. The additional tags 45' and 46' are duplicate copies of tags 45 and 46.

Figure 16:
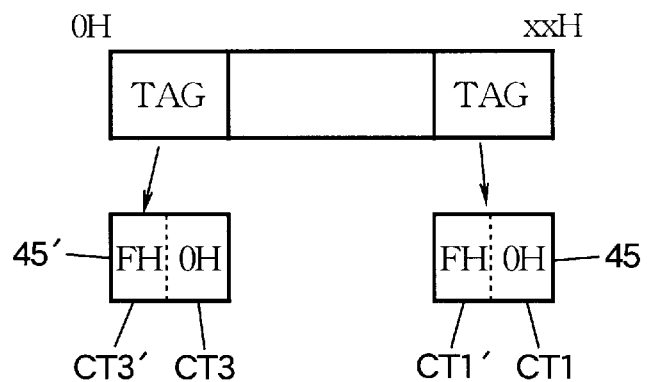
FIG. 16 illustrates data stored in the tag fields in the second embodiment.
Figure 17:
FIG. 17 illustrates modified data stored in the same tag fields.

FIG. 16 shows the initial state of the tags in the first directory. The two symbols CT3 and CT3' in tag 45' have the same complementary values (0H and FH) as the two symbols CT1 and CT1' in tag 45. When modifying symbols CT1 and CT1' in tag 45, the CPU 2 performs the same modification on symbols CT3 and CT3' in tag 45', maintaining the equality of the two pairs of symbols. FIG. 17 shows the state after such a modification; the pair of symbols CT3 and CT3' in tag 45' still have the same complementary values (now 1H and EH) as the pair of symbols CT1 and CT1' in tag 45.

In checking the tag values to decide which directory has the most recent reliable address information, the CPU 2 regards a directory as reliable if the directory has two identical pairs of mutually complementary tag symbols, and as unreliable if the two pairs are not identical, or if either pair is not complementary. As in the first embodiment, if both directories are reliable, the CPU 2 reads the directory with the more recent address information. If one directory is reliable and the other directory is unreliable, the CPU 2 reads the reliable directory.

Figure 18:
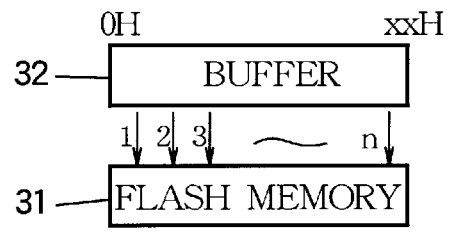
FIG. 18 illustrates the sequential transfer of data from the buffer to the memory array in a flash memory device.

FIG. 18 illustrates the writing of data from the buffer 32 into the memory array 31 in the flash memory 3. The n bytes of data are written one byte at a time, from byte one at address 0H to byte n at address xxH. In the first directory 41, tag 45' is written first and tag 45 last, while in the second directory 42, tag 46' is written first and tag 46 last.

Figure 19:
FIG. 19 illustrates an error condition in the second embodiment.

In certain situations, due to events interfering with both erasing and writing operations, it is possible that a directory might be left in a state like that shown in FIG. 19, in which the two symbols CT1 and CT1' in tag 45 have been correctly modified, but the two symbols CT3 and CT3' in tag 45' retain their previous values. This error would be detected by the second embodiment, because the two pairs of complementary values do not match, but would be missed by the first embodiment. The second embodiment thus provides even greater reliability, at the cost of only one additional tag byte in each directory.

The number of directories is not limited to two; the invention can also be practiced with more than two directories. To decide which directory holds the most recent reliable address information, the CPU 2 compares the tag information of all of the directories. The directories are used in a cyclic order; in recording and editing operations, address information is read from one directory, and updated address information is written to the next directory in the cycle.

Use of more than two directories can further extend the life of the audio recorder and player, by distributing erasewrite cycles over more directories, and can further reduce the likelihood of data loss, by providing multiple generations of backup address information.

There are various methods of managing tag information in multiple directories. The method shown in FIG. 13 can be extended to any number of directories by designating one directory as the last directory in the cycle, and modifying the tag value only when writing to this last directory.

The digital recording medium is not limited to flash memory, or even to semiconductor memory. The invention can also be practiced in devices that record audio information on rotating magnetic or optical disks, for example.

The directories do not have to be stored in the same digital recording medium as the audio data. A microcontroller, for example, can store address information in an internal nonvolatile semiconductor memory, and store audio data in an external nonvolatile semiconductor memory.

Those skilled in the art will recognize that further variations are possible within the scope claimed below.

What is claimed is:

1. An audio recorder and player, comprising:

a digital recording medium for recording audio data;

at least two directories, each of which holds address information indicating locations where the audio data is recorded on said digital recording medium;

a record controller recording the audio data on said digital recording medium, selecting one of said directories cyclically, writing address information corresponding to the recorded audio data in the selected one of said directories, and writing tag information in the selected one of said directories, the tag information identifying the selected one of said directories as the directory most recently selected by said record controller; and a play controller selecting the directory identified by the tag information as the directory most recently selected by the record controller, and reading the audio data from said digital recording medium according to the address information held in said directory.

2. The audio recorder and player of claim 1, wherein said record controller uses said tag information to find a directory, among said directories, holding most recent address information, reads said most recent address information, updates said most recent address information by adding the address information indicating where said sequence of audio data has been recorded, then selects, as said selected directory, a directory different from the directory from which said most recent address information was read, and writes the updated address information in said selected directory.

3. The audio recorder and player of claim 1, wherein said tag information comprises two complementary symbols.

4. The audio recorder and player of claim 3, wherein said play controller, when selecting a directory, checks the two symbols of the tag information written therein and selects, if possible, a directory in which said two symbols are complementary.

5. The audio recorder and player of claim 3, wherein said tag information comprises two identical pairs of mutually complementary symbols, and said play controller, when selecting a directory, checks the two pairs of symbols of the tag information recorded therein and selects, if possible, a directory in which said two pairs are identical and the symbols in each pair are complementary.

6. The audio recorder and player of claim 5, wherein said record controller writes said two identical pairs of mutually complementary symbols at opposite ends of said selected directory.

7. The audio recorder and player of claim 1, wherein said directories are stored in separate areas on the digital recording medium on which said audio data are recorded.

8. The audio recorder and player of claim 7, wherein said recording medium is a nonvolatile semiconductor memory that is divided into individually erasable pages, each directory occupying one of said pages.

9. The audio recorder and player of claim 8, wherein said digital recording medium comprises flash memory.

10. The audio recorder and player of claim 8, wherein said nonvolatile semiconductor memory has a memory array and a buffer, said buffer having a capacity of one page, and said record controller writes said address information in the selected directory by first transferring said address information to said buffer, then transferring said address information from said buffer to said selected directory.

11. A method of managing audio data in an audio recorder and player employing a digital recording medium, comprising the steps of:

(a) providing at least two directories, each storing address information and tag information, the address information indicating locations of said audio data on said digital recording medium;

(b) using said tag information to select said directories one-by-one in a cyclic order;

(c) updating the address information stored in said directories in the cyclic order of said step (b), when new audio data are recorded on said digital recording medium;

(d) using said tag information to select the most recently updated one of said directories; and (e) reading said audio data according to the address information stored in the directory selected in said step (d), when the audio data are played back.

12. A method of managing address information indicating locations of recorded audio data in an audio recorder and player employing at least one digital recording medium, comprising the steps of:

(a) allocating at least two areas on said digital recording medium as directories for storing said address information, said directories having respective tag fields for storing tag information;

(b) assigning a cyclic order to said address directories;

(c) using said tag information to select, from among said directories, a first directory storing most recent valid address information;

(d) reading the address information stored in said first directory, and using the address information thus read to perform at least one operation among playing, recording, and editing of said audio data;

(e) updating the address information thus read, if at least one operation among recording and editing has been performed, and writing the updated address information into a second directory following said first directory in said cyclic order; and (f) modifying said tag information as necessary to indicate that said second directory now stores the most recent valid address information, and writing the updated tag information in the tag field of said second directory.

13. The method of claim 12, wherein one of said directories is designated as a last directory in said cyclic order, and said step (f) further comprises the steps of:

writing, in said second directory, tag information different from the tag information stored in said first directory, if said second directory is said last directory; and copying the tag information stored in said first directory to said second directory without modification, if said second directory is not said last directory.

14. The method of claim 12, wherein said tag information comprises two complementary symbols.

15. The method of claim 14, wherein said step (f) comprises incrementing one of said two complementary symbols.

16. The method of claim 12, wherein each of said directories has two tag fields, and identical copies of said tag information are stored in said two tag fields.

17. The method of claim 16 wherein, in said steps (e) and (f), first said tag information is written into one of the two tag fields in said second directory, then the updated address information is written in said second directory, then said tag information is written in another one of the two tag fields in said second directory.

18. The method of claim 12, wherein the digital recording medium on which said directories are allocated is also used for storing said audio data.

19. The method of claim 12, wherein said digital recording medium is a semiconductor memory device.

20. The method of claim 19, wherein said digital recording medium is a flash memory device.

21. The method of claim 19, wherein said digital recording medium is divided into separately erasable pages, and each said directory occupies one of said pages.

* * * * *